United States Patent
Clausen et al.

(10) Patent No.: US 9,246,041 B1
(45) Date of Patent: Jan. 26, 2016

(54) APPARATUS AND METHOD FOR ALLOWING AVALANCHE PHOTODIODE BASED SINGLE-PHOTON DETECTORS TO BE DRIVEN BY THE SAME ELECTRICAL CIRCUIT IN GATED AND IN FREE-RUNNING MODES

(71) Applicant: id Quantique SA, Carouge GE (CH)

(72) Inventors: Bernard Clausen, Meyrin (CH); Laurent Monat, Omex (FR); Alexis Rochas, Valleiry (FR)

(73) Assignee: ID QUANTIQUE SA, Carouge GE (CH)

( * ) Notice: Subject to any disclaimer, the term of this patent is extended or adjusted under 35 U.S.C. 154(b) by 332 days.

(21) Appl. No.: 13/792,418

(22) Filed: Mar. 11, 2013

Related U.S. Application Data

(60) Provisional application No. 61/638,609, filed on Apr. 26, 2012.

(51) Int. Cl.
| | |
|---|---|
| *H01L 31/107* | (2006.01) |
| *H01L 29/74* | (2006.01) |
| *H03K 17/0416* | (2006.01) |
| *G01T 1/24* | (2006.01) |
| *H03K 17/74* | (2006.01) |

(52) U.S. Cl.
CPC ............ *H01L 31/107* (2013.01); *H01L 29/74* (2013.01); *H03K 17/0416* (2013.01); *G01T 1/248* (2013.01); *H03K 17/74* (2013.01)

(58) Field of Classification Search
CPC .... H03K 17/0416; H03K 17/74; H01L 29/74; G01T 1/248
See application file for complete search history.

(56) References Cited

U.S. PATENT DOCUMENTS

| | | | | |
|---|---|---|---|---|
| 2,590,216 | A * | 3/1952 | Schuhfried | ...... 607/72 |
| 2006/0175529 | A1 * | 8/2006 | Harmon et al. | ...... 250/207 |

OTHER PUBLICATIONS

Gisin et al., Quantum cryptography, Reviews of modern physics, Jan. 2002, p. 145-195, vol. 74.
Cova et al., Avalanche photodiodes and quenching circuits for single-photon-detection, Applied Optics, Apr. 20, 1996, p. 1956-1976, vol. 35, No. 12.
Ribordy at al., Performance of InGaAs/InP avalanche photodiodes as gated-mode photon counters, GAP-Optique (Group of Applied Physics) Sep. 5, 1997, p. 1-15, University of Geneva.
Thew et al., Free-running InGaAs/InP avalanche photodiode with active quenching for single photon counting at telecom wavelengths, Applied Physics Letters 91, Nov. 15, 2007, p. 201114-1-201114-3.
http://www.idquantique.com/scientific-instrumentation/id400-ingaaso-apd-single-photon-detector.html, May 23, 2010.

* cited by examiner

*Primary Examiner* — Francis M Legasse, Jr.
(74) *Attorney, Agent, or Firm* — Da Vinci Partners LLC; John Moetteli

(57) ABSTRACT

An apparatus and method for allowing avalanche photodiode based single-photon detectors to be driven by the same electrical circuit in gated and in free-running modes is proposed. The high-performance working of all the running modes relies on the capability of tuning the rise-time value of the electrical pulse driver which activates the avalanche photodiode in Geiger mode.

8 Claims, 5 Drawing Sheets

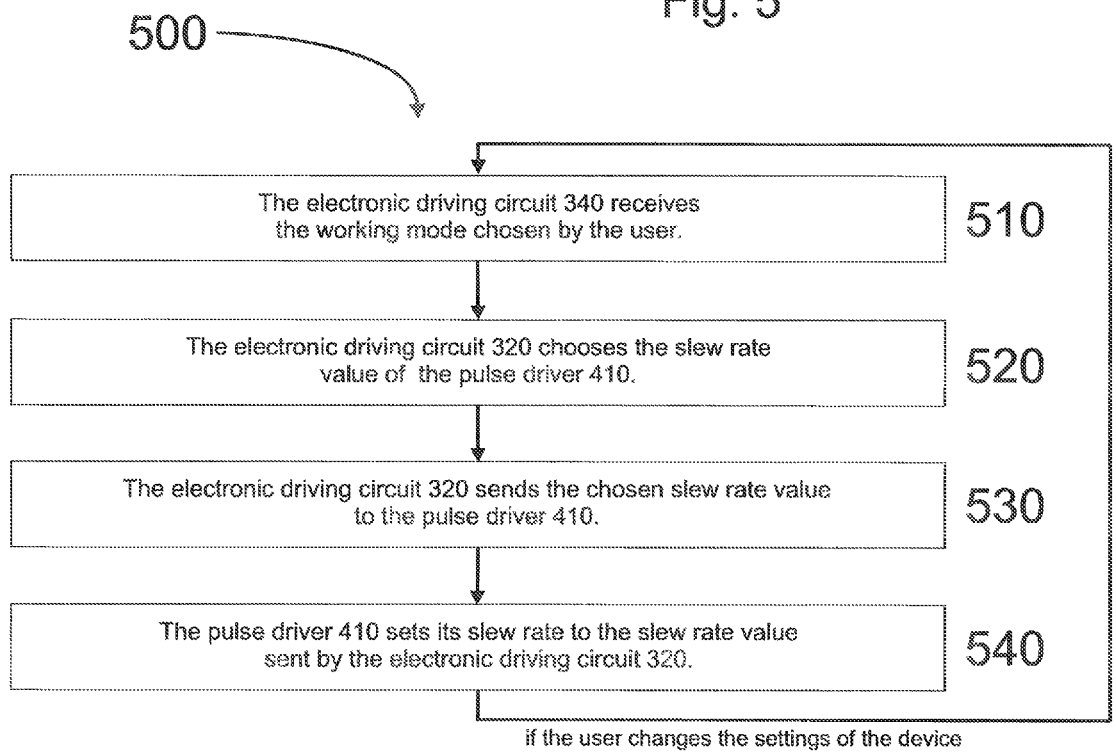

APPARATUS AND METHOD FOR ALLOWING AVALANCHE PHOTODIODE BASED SINGLE-PHOTON DETECTORS TO BE DRIVEN BY THE SAME ELECTRICAL CIRCUIT IN GATED AND IN FREE-RUNNING MODES

CROSS REFERENCE TO RELATED APPLICATIONS

This application claims the benefit of U.S. Provisional Application No. 61/638,609, filed Apr. 26, 2012, the content of which is incorporated herein by reference thereto.

BACKGROUND OF THE INVENTION

1. Field of the Invention

This invention relates generally to the field of single-photon detection, and more particularly to an apparatus and method for allowing the driving of avalanche photodiodes in several single-photon detection operating modes with a single electronic circuit by enabling the tunability of the rise-time of the electrical signal used for activating the photodiode in Geiger mode.

2. Description of the Prior Art

A single-photon is the elementary quantum of the electromagnetic field. Recently the detection of single-photons has generated a lot of interest. On the one hand, it allows reaching the ultimate sensitivity in the detection of light. This is useful in applications such as spectroscopy, single-molecule detection, range finding or photoluminescence where the probed system emits or reflects only a small quantity of light, which cannot be detected with a classical detector.

Single-photon detection also allows the exploitation of the quantum properties of photons to study quantum optics and to perform tasks which are not allowed by classical physics, such as quantum key distribution (Nicolas Gisin, Grégoire Ribordy, Wolfgang Tittel, and Hugo Zbinden, "Quantum Cryptography", Rev. of Mod. Phys. 74, (2002), the content of which is incorporated herein by reference thereto).

Good single-photon detectors working in free-running mode exist for visible and near-infrared wavelengths up to about 900 nm. At these wavelengths, Silicon avalanche photodiode operated in Geiger mode (S. Cova, M. Ghioni, A. Lacaita, C. Samori and F. Zappa, "Avalanche photodiodes and quenching circuits for single-photon detection, Appl. Opt. 35 (1996), the content of which is incorporated herein by reference thereto) achieve simultaneously high detection efficiencies (up to 80%) and low dark count probabilities (below 100 counts/s). They also feature low timing jitter (50 to 500 ps depending on the type of detector). Their afterpulsing probability is low, which makes it possible to use a short deadtime after each detection and in turn to achieve counting rates as high as ten megahertz.

Unfortunately, the situation is radically different beyond a wavelength of 900 or 1000 nm. Silicon based detectors cannot be used at these wavelengths, because the energy of the photons is smaller than the bandgap of this material, making band to band excitation by optical absorption impossible.

These wavelengths are however of great scientific and technological interest. As attenuation reaches a minimum around 1550 nm in optical fibers, most practical optical communication systems, both classical and quantum, work at a wavelength close to this wavelength. For quantum communications, good single-photon detectors are needed to build receivers. In the case of classical communications, such detectors are useful for characterization instruments, such as optical time domain reflectometers. When shined into an eye, 1550 nm light is absorbed in the vitreous humor, before it reaches the retina. Because of this important property, this wavelength is considered as "eye safe". It is used in applications such as LIDAR and range finding, where strong light pulses are sent into the atmosphere and can possibly be reflected in uncontrolled and hazardous manners. As the reflected and backscattered intensities can be low, single-photon detectors are also useful in this kind of applications.

In most cases where single-photon detection is needed at a wavelength beyond 1000 nm, people use InGaAs/InP avalanche photodiode operated in Geiger mode (Grégoire Ribordy, Jean-Daniel Gautier, Hugo Zbinden and Nicolas Gisin, "Perfomance of InGaAs/InP avalanche photodiode as gated-mode photon counters", Appl. Opt. 37 (1998), the content of which is incorporated herein by reference thereto). These detectors unfortunately exhibit a high afterpulsing probability due to fabrication quality issues. Because of this, free running operation is quite difficult to implement. Hence, they are used in gated mode in a large majority of the applications. The gated operating mode is implemented with a gate pulse driver which activates the avalanche photodiode in Geiger mode during the duration of the gate applied by the driver. The fabrication quality of InGaAs/InP avalanche photodiodes has, nevertheless, been strongly improved those last few years. Free running operation has been demonstrated (Robert Thew, Damien Stucki, Jean-Daniel Gautier, Hugo Thinden, Alexis Rochas, "Free-running InGaAs/InP avalanche photodiode with active quenching for single photon counting at telecom wavelengths", Appl. Phy. Lett. 91 (2007), the content of which is incorporated herein by reference thereto). Even if the free-running mode has lower noise performances than the gated mode, it is more and more appreciated by people working with asynchronous optical signals.

The best for a commercial single-photon device based on InGaAs/InP avalanche photodiodes is to give the possibility to the user to operate it either in gated mode or free-running modes. However, those two operating modes have some antagonistic requirements. Especially, when the detector is activated with short gates (width <5 ns), the rise-time of the gate needs to be very short. If the same rise-time value is used for long gate (>5 ns) or free-running operations, the overshot of the electrical signal implies an oscillation of the efficiency of the detector for a period of several nanoseconds after the rising edge of the electrical signal. This phenomenon avoids the capability of effectively driving the avalanche photodiode in all the operating modes with a single electronic circuit if it is impossible to tune the rising time of the electrical signal.

What is needed therefore, to allow the effective driving of avalanche photodiodes in all the possible single-photon detection operating modes with a single electrical driving circuit, is a technique which enables the tunability of the rising time of the electrical signal used for activating the photodiode in Geiger mode.

SUMMARY OF THE INVENTION

An apparatus and method for allowing avalanche photodiode based single-photon detectors to be driven by the same electrical circuit in gated and in free-running modes is proposed. The high-performance working of all the running modes relies on the capability of tuning the rise-time value of the electrical pulse driver which activates the avalanche photodiode in Geiger mode.

The primary object of the invention is to allow a single electrical circuit to drive avalanche photodiodes used for single-photon detection in all single-photon detection modes (gated and free-running modes). By tuning its rise-time, the electrical driving circuit can drive the avalanche photodiodes in all modes with optimal performances.

The rise-time can be tuned with at least two techniques. In the first technique, the rise-time is changed by varying the slew rate of the output signal of the electrical driving circuit. In the second technique, the output signal of the driving circuit goes from the low to the high levels through a stair-step ramp. The rise-time of this output signal can be tuned by changing the slope of this ramp.

Other objects and advantages of the present invention will become apparent from the following descriptions, taken in connection with the accompanying drawings, wherein, by way of illustration and example, an embodiment of the present invention is disclosed.

BRIEF DESCRIPTION OF THE DRAWINGS

FIG. 5 shows a high-level flow chart of the choice and setting of the optimal rise-time when the invention is included in the single-photon detection system.

DETAILED DESCRIPTION OF THE PREFERRED EMBODIMENTS

Detailed descriptions of the preferred embodiment are provided herein. It is to be understood, however, that the present invention may be embodied in various forms. Therefore, specific details disclosed herein are not to be interpreted as limiting, but rather as a basis for the claims and as a representative basis for teaching one skilled in the art to employ the present invention in virtually any appropriately detailed system, structure or manner.

In this invention, it is proposed to replace the standard activation gate pulse driver of a single-photon detector based on avalanche photodiode by an activation gate pulse driver with tunable rise-time (In electronics, the rise-time refers to the time required for a signal to change from a specified low value to a specified high value). The standard activation gate pulse driver consists of an electrical pulse generator driven by a digital signal. This pulse generator generates electrical pulses with fixed amplitude and given temporal duration. This temporal duration can be defined by the digital signal or by a fixed delay. When the duration of the pulse is defined by the digital signal, it is possible to vary the duration of the pulse by varying the one of the digital signal.

In the case of a gate pulse driver with tunable gate width, the flatness quality of the voltage gate releases strongly on the rise-time value of the pulse driver. Indeed, when the rise-time of the pulse driver is short, the front edge of the electrical voltage pulse applied on the photodiode is very steep and there is a strong voltage overshoot. This overshoot may last several ns. This means that the voltage applied on the photodiode, and by consequence the efficiency of the detector, may vary over this period of time. This effect has a weak impact on short gates, but a big one on large gates.

Figure 1:
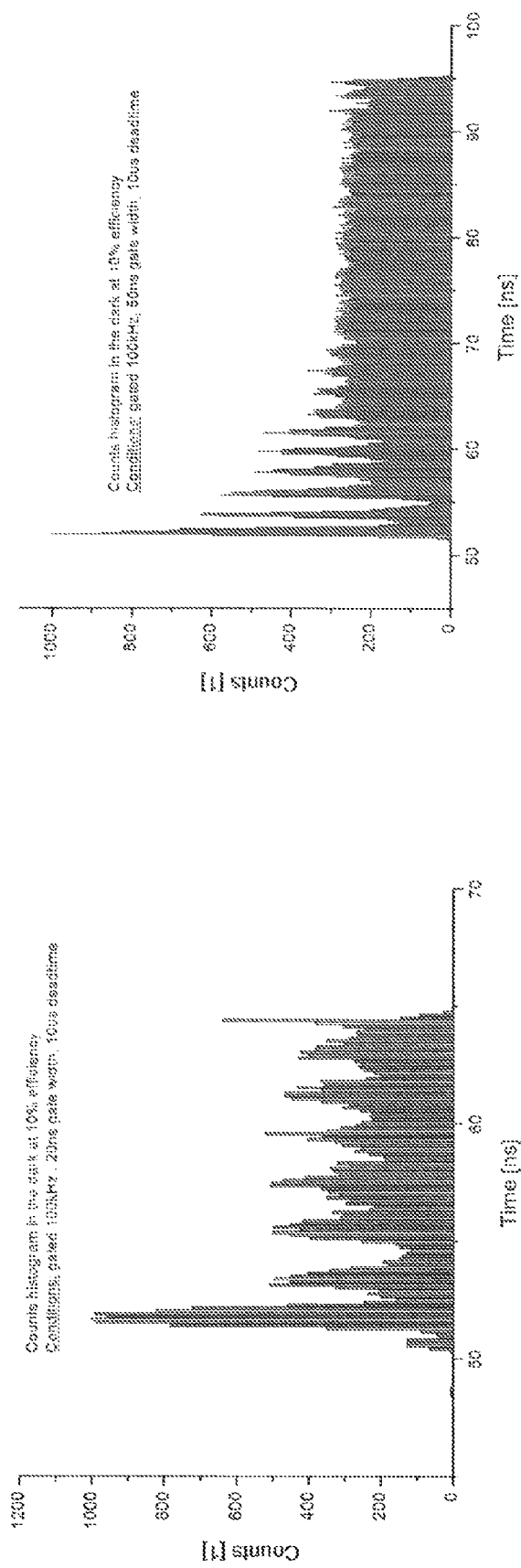
FIG. 1 shows the non-uniformity of the detection efficiency of a single-photon detector based on avalanche photodiode without the invention.

For short gates, the shorter the rise-time, the shorter the gate. For long gates, a reasonably long rise-time allows a better homogeneity of the efficiency over the gate. This is also true in the free-running mode which can be considered as the extreme case of long gates. The standard activation gate pulse drivers do not allow one to vary its rise-time value. Hence, in order to tune the gate duration on a large range, either a trade-off needs to be found between the two regimes, or one of the two regimes is favoured to the detriment of the other one. For example, as it was the case in the id-201 product from ID Quantique SA, the short gate (<5 ns) regime can be favoured with a short rise-time pulse driver. But, by consequence, the uniformity of the efficiency within the long gates (>5 ns) is not very good especially over the first 20 nanoseconds as can be seen in FIG. 1.

Figure 2:
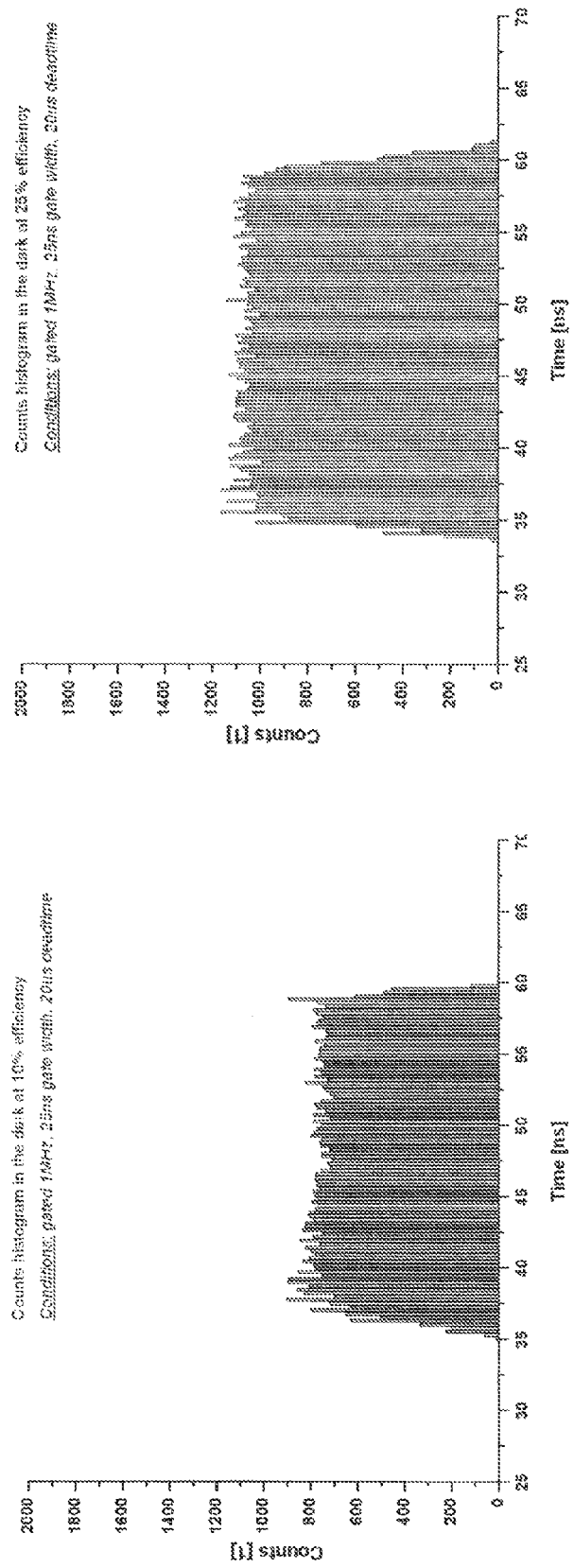
FIG. 2 shows the uniformity of the detection efficiency of a single-photon detector based on avalanche photodiode with the invention.

In order to have a single-photon detector with a single activation gate pulse driver which allows high performances in the short gate and long gate regimes, it is essential to be able to tune the rise-time of the gate pulse driver depending on the kind of working regime of the detector. One way to tune the rise-time of a pulse driver is to change its slew rate value. For example, a gate pulse driver with at least two values of slew rate is an essential improvement of the detector when this detector is used with short and long gates, and even in free running mode. In FIG. 2, an example of efficiency uniformity over a gate of 25 ns obtained with an optimal slew rate value is shown. In this case, the efficiency over the whole is very uniform compare to the cases shown in FIG. 1. This demonstrates the improvement that can be obtained with a pulse driver including a way to tune its rise-time.

Another way to vary the rise-time of a gate pulse driver is to change its output signal step by step till reaching the final expected signal value. Depending on the delay between successive steps, the rise-time of the gate pulse driver can be changed. In this case, the pulse driver output goes from the low to the high levels via a stair-step ramp. For example, if the pulse driver is able to generate two different pulse amplitudes, it can generate a pulse at the low amplitude first, and then, after few hundreds or thousands of ps, increases the amplitude of its output to the high value. Because the rise of voltage is smaller in the second step compare to the case of a pulse driver with single pulse amplitude and the overshoot due to the first rise of voltage is partially finished when the second step occurs, the overshoot consequent to this dual amplitude pulse is smaller than the one consequent to a single amplitude pulse. Hence, as changing the slew rate value, this method allows the same gate pulse driver to drive efficiently photodiode in Geiger mode with short and long gates.

Figure 3:
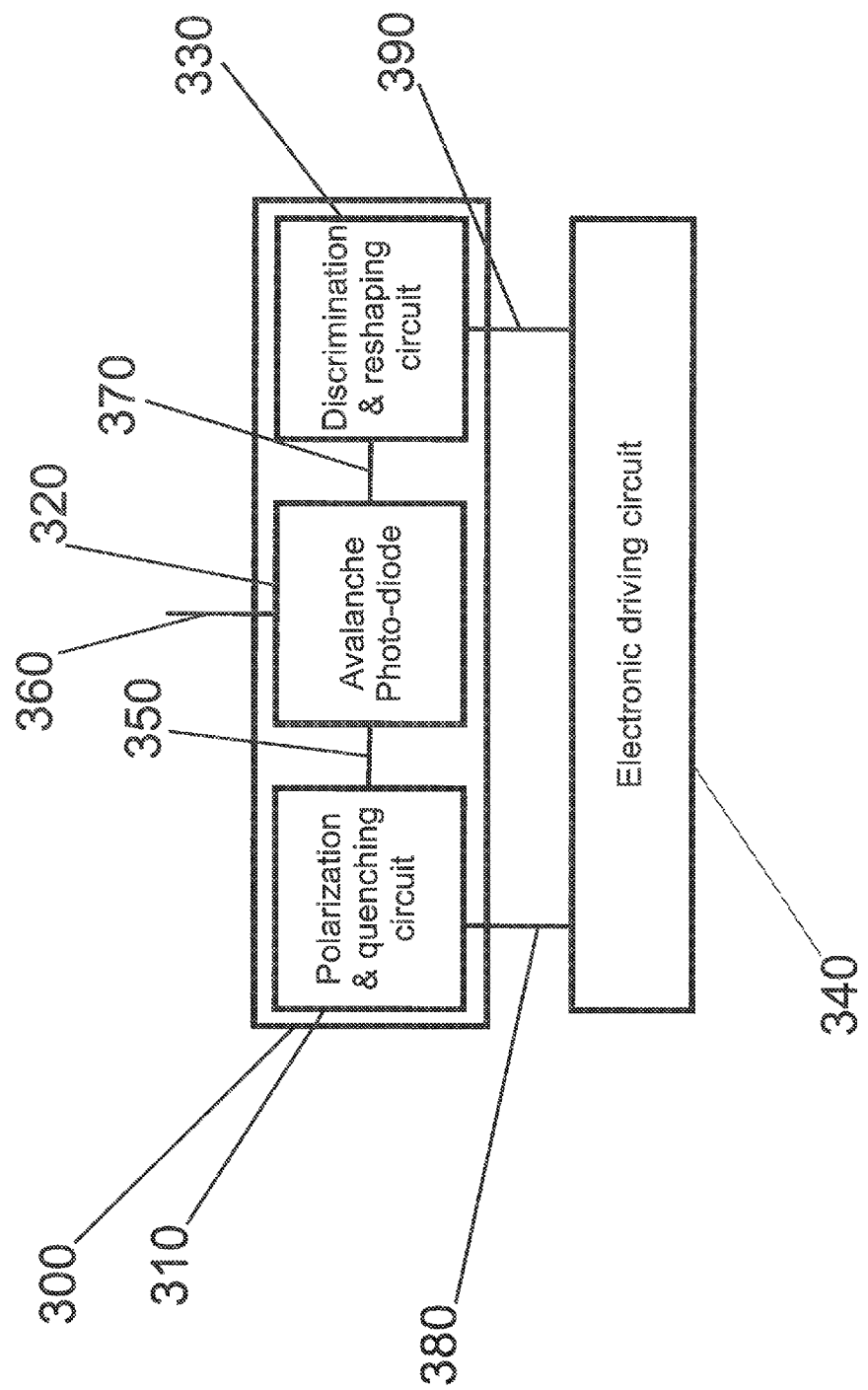
FIG. 3 shows a single-photon detector based on avalanche photodiode.

Referring now to FIG. 3, one possible embodiment of an avalanche photodiode based single-photon detector 300 can be seen. The single-photon detector 300 comprises an avalanche photodiode 320 which is used in Geiger mode (see details in reference S. Cova, M Ghioni, A. Lacaita, C. Samori, and F. Zappa in Applied Optics vol. 35 (1996), incorporated by reference above) to detect single photons, a polarization and quenching circuit 310 used for setting the avalanche photodiode 320 in Geiger mode and quenching the avalanche once a photon has been detected, and a discrimination and reshaping circuit 330 used for discriminating and reshaping the output signal of the avalanche photodiode 320 in order to produce electrical signals which are adapted to the electronic driving circuit 300. The avalanche photodiode can, for example, be made of silicon (Si) or Ill-V semiconductor material, such as InP/InGaAs. Depending on the kind of semiconductor material which is used, the avalanche photodiode 320 can work either in free-running or gated modes.

The polarization and quenching circuit 310 can comprise several electronic components assembled on a board to make the avalanche photodiode run in one of the two possible working modes. The discrimination and reshaping circuit 330 can, for example, comprise a discriminator of electronic pulses and a converter of logical electrical signals. The avalanche photodiode 320 is connected to optical signal by an optical connection 360. This optical connection 360 can be made up of an optical fibre for example. The avalanche photodiode 320 is linked to the polarization and quenching circuit 310 via the transmission line 350. If the single-photon detector 300 is working in free-running mode with active quenching, the transmission line 350 is used to apply the appropriate bias voltage value on the avalanche photodiode 320 and the continuous activation gate at the appropriate time (the activation gate is suppressed after each detection to reduce the noise due to charge persistence effect) and with the appropriate amplitude. The avalanches are quenched by suppressing the activation gate once the avalanches have been detected. If the single-photon detector 300 is working in gated mode, the transmission line 350 is used for applying the appropriate bias voltage value on the avalanche photodiode 320 and the activation gate at the appropriate time and with the appropriate amplitude. The transmission line 350 can, for example, be made up of wires or cables carrying electronic signals. The avalanche photodiode 320 is linked to the discrimination and reshaping circuit 330 via the transmission line 370. The transmission line 370 is used for transmitting the output electrical signal of the avalanche photodiode 320 to the discrimination and reshaping circuit 330. The transmission line 370 can, for example, be made up of wires or cables carrying electronic signals. An electronic driving circuit 340 deals with all the inputs and outputs required or provided by the single-photon detector 300. The electronic driving circuit 340 can, for example, be included in a Field-Programmable Gate Array. Some of the inputs sent by the electronic driving circuit 340 to the single-photon detector 300 are its efficiency and the time when it needs to be active. The polarization and quenching circuit 310 is linked to the electronic driving circuit 340 via the transmission line 380. When the single-photon detector 300 is working in free-running mode, the transmission line 380 is used by the electronic driving circuit 340 for transmitting the setting values (for example, bias voltage value) corresponding to the efficiency value chosen by the user. When the single-photon detector 300 is working in gated mode, the transmission line 380 is used for transmitting the setting values (for example, bias voltage value and activation gates) corresponding to the efficiency value and the time of activation chosen by the user. The discrimination and reshaping circuit 330 is connected to the electronic driving circuit 340 via the transmission line 390. This transmission line 390 is used to transmit the outcomes of the discrimination and reshaping circuit 330 to the electronic driving circuit 340. The transmission lines 380 and 390 can, for example, be made up of wires or cables carrying electronic signals.

Figure 4:
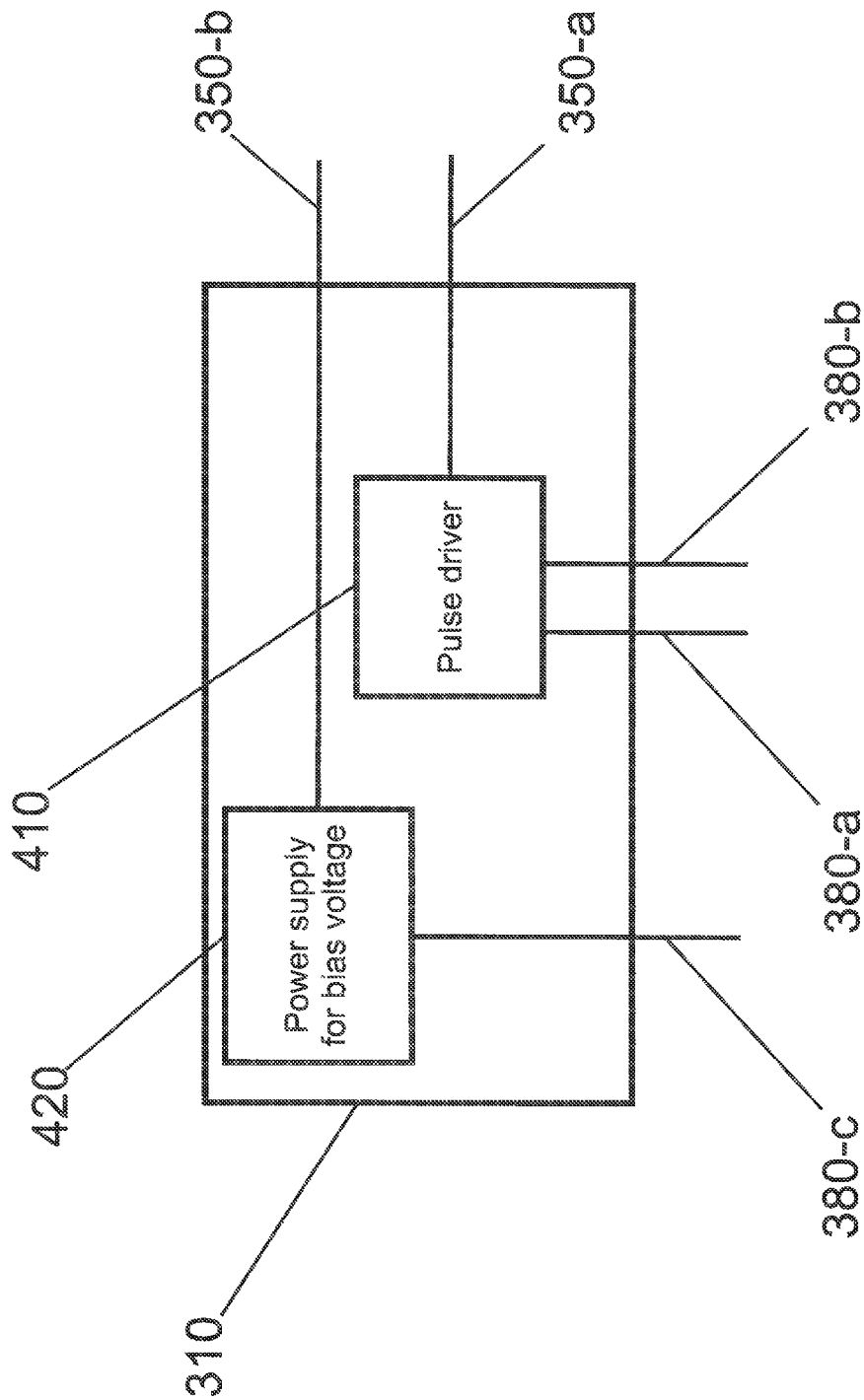
FIG. 4 shows the polarization and quenching circuit 310 with one embodiment of the invention.

Referring now to FIG. 4, one possible embodiment of the polarization and quenching circuit 310 can be seen. For the clarity of the explanations, the transmission lines 350 and 380 have been split into several sub-lines (e.g. 350-*a* and 350-*b*). The polarization and quenching circuit 310 consists of a gate pulse driver 410 and a power supply 420. The power supply 420 is used for applying the bias voltage on the avalanche photodiode 320. This power supply 420 can for example be a digital to analog converter. It receives the bias voltage to apply from the electronic driving circuit 340 through the transmission line 380-*c*. The bias voltage is applied on the avalanche photodiode 320 through the transmission line 350-*b*. The pulse driver 410 is used for applying the activation gate onto the avalanche photodiode 320. The pulse driver 410 receives from the electronic driving circuit 340 the timing of the activation gate and/or the timing for the quenching through the transmission line 380-*a*.

In the case when the invention consists in changing the slew rate of the pulse driver 410, the transmission line 380-*b* is used by the electronic circuit 340 for sending the slew rate value to the pulse driver. For example, the pulse driver can be made of a fast discriminator. The output of this discriminator is a digital signal which equals '0' when the input signal is lower than a threshold value and '1' in the other case. The tunability of the pulse driver 410 can be implemented by adding a 'RC' filter at the output of the discriminator. If, for example, the resistance of this 'RC' filter is a digital potentiometer, it is possible to tune the output impedance of the pulse driver 410. By tuning the output impedance of the pulse driver 410, the slew rate value can be changed. These fast discriminator and 'RC' filter can be contained in a single chirp like for example an Application Specific Integrated Circuit (ASIC).

In the case when the invention consists in varying the amplitude of the gate of the pulse driver 410 step by step, the transmission line 380-*b* is used by the electronic circuit 340 for sending rise-time to the pulse driver. For example, the pulse driver 410 can be made of 'N' fast discriminators. The outputs of all the discriminators can be delayed ones compare to the others and are summed with an electrical summation circuit. Depending on the value of the rise-time sent through the transmission line 380-*b*, a given delay between each successive discriminator is chosen. By activating the discriminators ones after the others and changing the delay between two consecutive discriminators, the rise-time to reach the final amplitude gate can be varied. These fast discriminators and summation circuit can be contained in a single chirp like for example an Application Specific Integrated Circuit (ASIC).

Referring now to FIG. 5, the method 500 to set the rise-time value depending on the operating mode chosen by the user of the single-photon detector includes the following steps.

In a first step 510, the electronic driving circuit 340 receives the operating mode chosen by the user. This operating mode can be either the gated or free-running modes. If it is the gated mode, the user can choose either to work with short gates (e.g. <5 ns) or with long gates (e.g. >5 ns).

In a second step 520, the electronic driving circuit 320 chooses the rise-time value of the pulse driver 410. Depending on the operating mode chosen by the user, the electronic driving circuit 320 chooses the optimal rise-time value. This can be done by searching in a look-up table stored in an internal memory. However, if the user has specified a rise-time value, the electronic driving circuit 320 will use this specified value as chosen rise-time value.

In a third step 530, the electronic driving circuit 320 sends the chosen rise-time value to the pulse driver 410 through the connection 350.

In a fourth step 540, the pulse driver 410 sets its rise-time to the rise-time value sent by the electronic driving circuit 320. This value is not changed till the user changes the operating settings of the single-photon detection device.

While the invention has been described in connection with a preferred embodiment, it is not intended to limit the scope of the invention to the particular form set forth, but on the contrary, it is intended to cover such alternatives, modifications, and equivalents as may be included within the spirit and scope of the invention as defined by the appended claims.

What is claimed is:

1. A single-photon detection apparatus containing a pulse driver, used for setting the avalanche photodiode in Geiger mode, having a tunable rise-time wherein said tunable rise-time pulse driver enables high-performance working of the said single-photon detection in both operating modes: gated and free-running modes.

2. The apparatus of claim 1 wherein the said rise-time is tuned by changing the slew rate of the output signal of the said pulse driver.

3. The apparatus of claim 2 wherein the said slew rate tunability is implemented by varying the output impedance of the said pulse driver.

4. The apparatus of claim 2, wherein the said pulse driver contains at least one chip or ASIC whose slew rate can be tuned.

5. The apparatus of claim 1 wherein the said rise-time is tuned by changing the parameters of the stair-step ramp of the output signal of the said pulse driver.

6. The apparatus of claim 3 wherein the said stair-step ramp is implemented with several pulse drivers whose outputs are delayed ones compare to the others and then summed.

7. The apparatus of claims wherein the said pulse driver contains at least one chip or ASIC which enables the generation of a tunable stair-step ramp.

8. A method for enabling the high-performance driving of avalanche photodiode based single photon detector in both gated and free-running modes with a single electronic driver, the method using the apparatus of claim 1 and comprising the steps of:
choosing the optimal rise-time value according to the settings chosen by the user,
setting of the pulse driver to the chosen rise-time value.

* * * * *